(12) United States Patent
Chen et al.

(10) Patent No.: US 12,113,555 B2
(45) Date of Patent: Oct. 8, 2024

(54) DATA COMPRESSION SELECTION SYSTEM

(71) Applicant: GM Global Technology Operations LLC, Detroit, MI (US)

(72) Inventors: Shu Chen, Rochester Hills, MI (US); Jinzhu Chen, Troy, MI (US); Donald K. Grimm, Utica, MI (US); Mahesh Pottelu, Shelby Township, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 370 days.

(21) Appl. No.: 17/680,758

(22) Filed: Feb. 25, 2022

(65) Prior Publication Data

US 2023/0275598 A1    Aug. 31, 2023

(51) Int. Cl.
*G06F 16/2455*    (2019.01)
*H03M 7/30*    (2006.01)

(52) U.S. Cl.
CPC .......... *H03M 7/70* (2013.01); *G06F 16/2455* (2019.01); *H03M 7/6064* (2013.01)

(58) Field of Classification Search
CPC .................................................. G06F 16/2455
See application file for complete search history.

(56) References Cited

U.S. PATENT DOCUMENTS

| 11,190,419 | B1 * | 11/2021 | Priescu | H04L 41/5019 |
| 2017/0188067 | A1 * | 6/2017 | Sullivan | H04N 21/4667 |
| 2018/0331697 | A1 * | 11/2018 | Lin | H04L 1/0057 |

* cited by examiner

*Primary Examiner* — Grace Park
(74) *Attorney, Agent, or Firm* — Vivacqua Crane, PLLC

(57) ABSTRACT

A system comprises a computer including a processor and a memory. The memory includes instructions such that the processor is programmed to: receive metadata and results including at least one data transmission constraint, perform a search of a k-d tree based on the at least one data transmission constraint, and select at least one data compression process from the k-d tree based on the search. The k-d tree includes a plurality of nodes corresponding to data compression solutions.

18 Claims, 5 Drawing Sheets

DATA COMPRESSION SELECTION SYSTEM

INTRODUCTION

The present disclosure relates to selecting data compression techniques for transmitting vehicle data.

Compressing data for efficient processing, transfer, and storage is desirable in the data processing field. Various data processing devices can compress data prior to processing or transmitting the data over a network. Compression of data is performed to reduce the size or volume of data for processing, transmission, or storage. For example, in case of transmission of data, available network bandwidth capacity may be a limited resource.

The cost required to transmit data has significantly increased as the size or volume of data involved with transmission increased. For example, some vehicles may generate over twenty gigabytes (20 GB) of data per hour. Reducing the size or volume of data for processing and transmission through compression may potentially result in significant cost savings. Moreover, compression of data consumes a relatively low level of computing power with limited resources and various compression algorithms are available for implementation.

SUMMARY

A system comprises a computer including a processor and a memory. The memory includes instructions such that the processor is programmed to: receive metadata and results corresponding to at least one data transmission constraint, perform a search of a k-d tree based on at least one data transmission constraint, and select at least one data compression process from the k-d tree based on the search. The k-d tree includes a plurality of nodes corresponding to data compression solutions.

In other features, the processor is further programmed to transmit the at least one data compression process to a vehicle.

In other features, the metadata and the results are transmitted by the vehicle.

In other features, the processor is further programmed to perform a gradient-based search when at least one additional node has to be inserted into the k-d tree.

In other features, the at least one data compression process comprises at least one of a lossy data compression process or a lossless data compression process.

In other features, compressing data according to the selected data compression process comprises at least one of transform coding, adaptive sampling, quantization, differential coding, or arithmetic coding.

In other features, the processor is further programmed to select a first data compression process for a first portion of vehicle data and select a second data compression process for a second portion of vehicle data, wherein the second data compression process is different from the first data compression process.

In other features, the data compression constraint comprises at least one of central processing unit (CPU) usage, memory usage, latency, loss rate, input/output (I/O) cost, power consumption limit, or bandwidth limit.

In other features, the processor is further programmed to generate a metric space based on emulating at least computing costs corresponding to a vehicle, wherein the metric space comprises a plurality of data compression process solutions for compressing vehicle data.

In other features, the metric space comprises a Euclidean space defining a distance between at least a first node and a second node of the plurality of nodes.

A method includes receiving metadata and results corresponding to at least one data transmission constraint, performing a search of a k-d tree based on the at least one data transmission constraint, and selecting at least one data compression process from the k-d tree based on the search, wherein the k-d tree includes a plurality of nodes corresponding to data compression solutions.

In other features, the method further includes transmitting the at least one data compression process to a vehicle.

In other features, the metadata and the results are transmitted by the vehicle.

In other features, the method further includes performing a gradient-based search when at least one additional node has been inserted into the k-d tree.

In other features, the at least one data compression process comprises at least one of a lossy data compression process or a lossless data compression process.

In other features, compressing data according to the selected data compression process comprises at least one of transform coding, adaptive sampling, quantization, differential coding, or arithmetic coding.

In other features, the method further includes selecting a first data compression process for a first portion of vehicle data and select a second data compression process for a second portion of vehicle data, wherein the second data compression process is different from the first data compression process.

In other features, the data compression constraint comprises at least one of central processing unit (CPU) usage, memory usage, latency, loss rate, input/output (I/O) cost, power consumption limit, or bandwidth limit.

In other features, the method further includes generating a metric space based on emulating at least computing costs corresponding to a vehicle, wherein the metric space comprises a plurality of data compression process solutions for compressing vehicle data.

In other features, the metric space comprises a Euclidean space defining a distance between at least a first node and a second node of the plurality of nodes.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
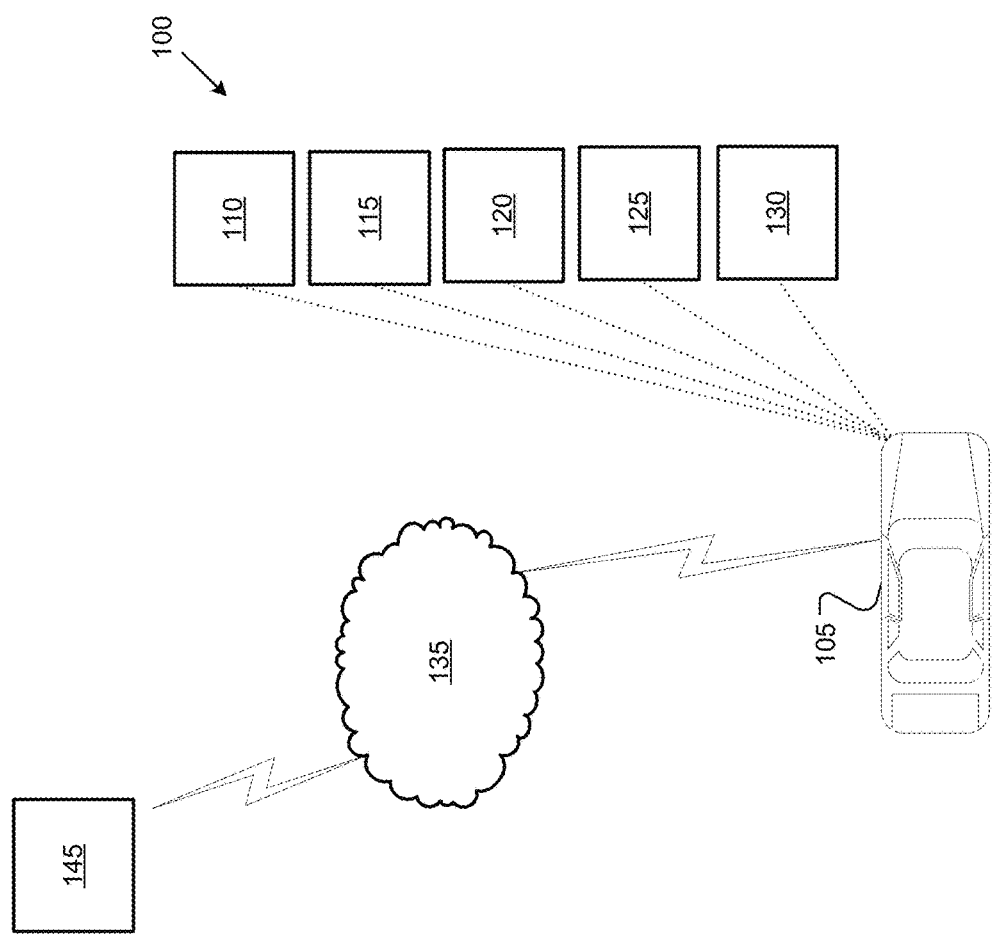
FIG. 1 is a block diagram of an example system including a vehicle.

FIG. 1 is a block diagram of an example vehicle system 100. The system 100 includes a vehicle 105, which can comprise a land vehicle such as a car, truck, etc., an aerial vehicle, and/or an aquatic vehicle. The vehicle 105 includes a computer 110, vehicle sensors 115, actuators 120 to actuate various vehicle components 125, and a vehicle communications module 130. Via a network 135, the communications module 130 allows the computer 110 to communicate with a server 145.

The computer 110 may operate a vehicle 105 in an autonomous, a semi-autonomous mode, or a non-autonomous (manual) mode. For purposes of this disclosure, an autonomous mode is defined as one in which each of vehicle 105 propulsion, braking, and steering are controlled by the computer 110; in a semi-autonomous mode the computer 110 controls one or two of vehicles 105 propulsion, braking, and steering; in a non-autonomous mode a human operator controls each of vehicle 105 propulsion, braking, and steering.

The computer 110 may include programming to operate one or more of vehicle 105 brakes, propulsion (e.g., control of acceleration in the vehicle by controlling one or more of an internal combustion engine, electric motor, hybrid engine, etc.), steering, climate control, interior and/or exterior lights, etc., as well as to determine whether and when the computer 110, as opposed to a human operator, is to control such operations. Additionally, the computer 110 may be programmed to determine whether and when a human operator is to control such operations.

The computer 110 may include or be communicatively coupled to, e.g., via the vehicle 105 communications module 130 as described further below, more than one processor, e.g., included in electronic controller units (ECUs) or the like included in the vehicle 105 for monitoring and/or controlling various vehicle components 125, e.g., a powertrain controller, a brake controller, a steering controller, etc. Further, the computer 110 may communicate, via the vehicle 105 communications module 130, with a navigation system that uses the Global Position System (GPS). As an example, the computer 110 may request and receive location data of the vehicle 105. The location data may be in a known form, e.g., geo-coordinates (latitudinal and longitudinal coordinates).

The computer 110 is generally arranged for communications on the vehicle 105 communications module 130 and also with a vehicle 105 internal wired and/or wireless network, e.g., a bus or the like in the vehicle 105 such as a controller area network (CAN) or the like, and/or other wired and/or wireless mechanisms.

Via the vehicle 105 communications network, the computer 110 may transmit messages to various devices in the vehicle 105 and/or receive messages from the various devices, e.g., vehicle sensors 115, actuators 120, vehicle components 125, a human machine interface (HMI), etc. Alternatively or additionally, in cases where the computer 110 actually comprises a plurality of devices, the vehicle 105 communications network may be used for communications between devices represented as the computer 110 in this disclosure. Further, as mentioned below, various controllers and/or vehicle sensors 115 may provide data to the computer 110. The vehicle 105 communications network can include one or more gateway modules that provide interoperability between various networks and devices within the vehicle 105, such as protocol translators, impedance matchers, rate converters, and the like.

Vehicle sensors 115 may include a variety of devices such as are known to provide data to the computer 110. For example, the vehicle sensors 115 may include wheel sensors that measure tire forces. The vehicle sensors 115 may also include Light Detection and Ranging (lidar) sensor(s) 115, etc., disposed on a top of the vehicle 105, behind a vehicle 105 front windshield, around the vehicle 105, etc., that provide relative locations, sizes, and shapes of objects and/or conditions surrounding the vehicle 105. As another example, one or more radar sensors 115 fixed to vehicle 105 bumpers may provide data to provide and range velocity of objects (possibly including second vehicles 106), etc., relative to the location of the vehicle 105. The vehicle sensors 115 may further include camera sensor(s) 115, e.g., front view, side view, rear view, etc., providing images from a field of view inside and/or outside the vehicle 105.

The vehicle 105 actuators 120 are implemented via circuits, chips, motors, or other electronic and or mechanical components that can actuate various vehicle subsystems in accordance with appropriate control signals as is known. The actuators 120 may be used to control components 125, including braking, acceleration, and steering of a vehicle 105.

In the context of the present disclosure, a vehicle component 125 is one or more hardware components adapted to perform a mechanical or electro-mechanical function or operation—such as moving the vehicle 105, slowing or stopping the vehicle 105, steering the vehicle 105, etc. Non-limiting examples of components 125 include a propulsion component (that includes, e.g., an internal combustion engine and/or an electric motor, etc.), a transmission component, a steering component (e.g., that may include one or more of a steering wheel, a steering rack, etc.), a park assist component, an adaptive cruise control component, an adaptive steering component, a movable seat, an anti-lock braking system component (ABS), a traction control system component (TCS), and/or an electronic stability control system component.

In addition, the computer 110 may be configured for communicating via a vehicle-to-vehicle communication module or interface 130 with devices outside of the vehicle 105, e.g., through a vehicle to vehicle (V2V) or vehicle-to-infrastructure (V2X) wireless communications to another vehicle, to (typically via the network 135) a remote server 145. The module 130 could include one or more mechanisms by which the computer 110 may communicate, including any desired combination of wireless (e.g., cellular, wireless, satellite, microwave and radio frequency) communication mechanisms and any desired network topology (or topologies when a plurality of communication mechanisms are utilized). Exemplary communications provided via the module 130 include cellular, Bluetooth®, IEEE 802.11, dedicated short-range communications (DSRC), and/or wide area networks (WAN), including the Internet, providing data communication services.

The network 135 can be one or more of various wired or wireless communication mechanisms, including any desired combination of wired (e.g., cable and fiber) and/or wireless (e.g., cellular, wireless, satellite, microwave, and radio frequency) communication mechanisms and any desired network topology (or topologies when multiple communication mechanisms are utilized). Exemplary communication networks include wireless communication networks (e.g., using Bluetooth, Bluetooth Low Energy (BLE), IEEE 802.11, vehicle-to-vehicle (V2V) such as Dedicated Short-Range Communications (DSRC), etc.), local area networks (LAN) and/or wide area networks (WAN), including the Internet, providing data communication services.

Figure 2:
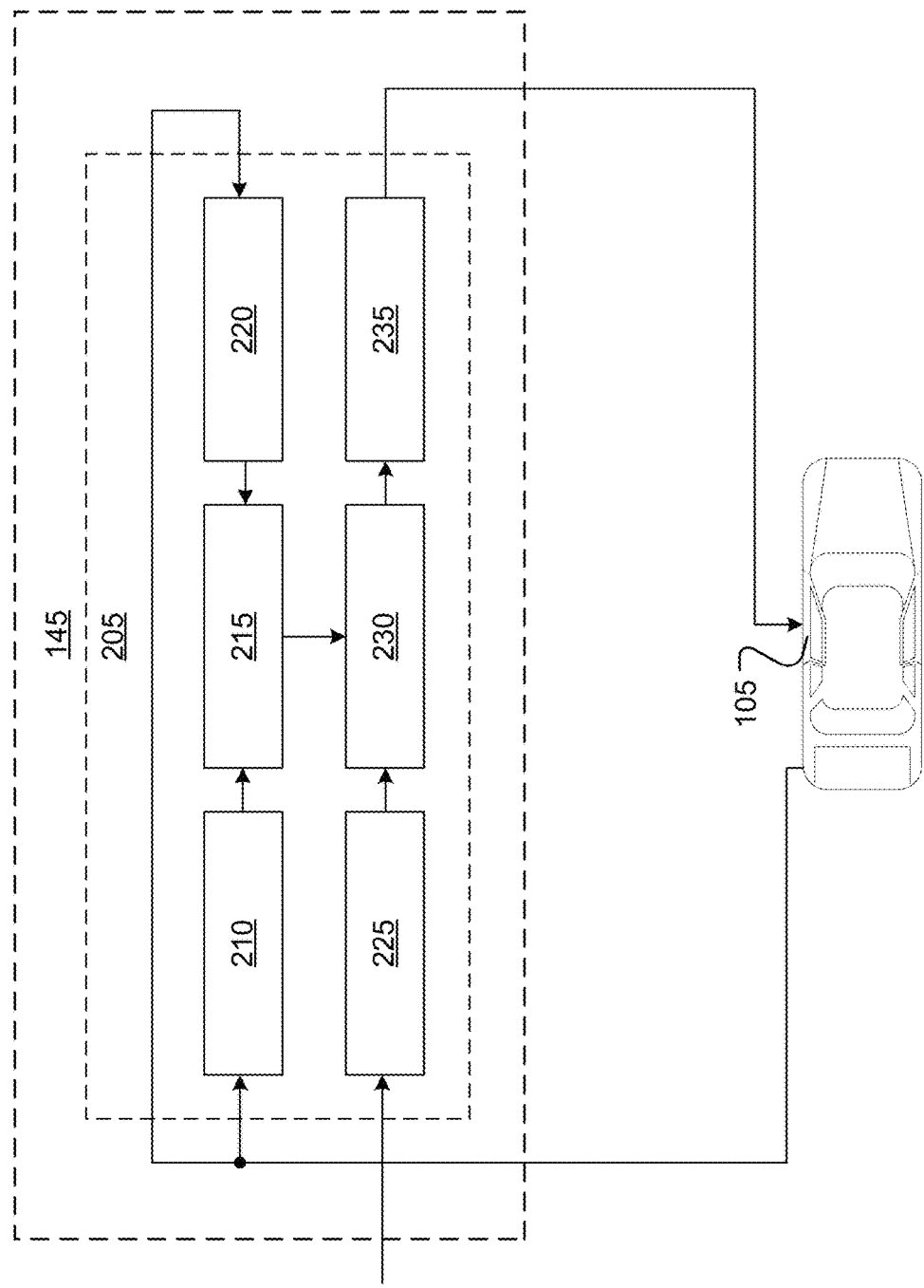
FIG. 2 is a block diagram of an example server.

FIG. 2 illustrates an example server 145 that includes a data compression selection module 205. As shown, the data compression selection module 205 includes a statistical analysis module 210, a metrics space adjustment module 215, a metric space initialization module 220, a compression selection module 225, a k-d tree search module 230, and a compression transmission module 235. As discussed herein, the data compression selection module 205 selects a data compression process having the highest compression ratio based on one or more data transmission constraints.

During operation, the server 145 receives vehicle data and/or vehicle metadata from the vehicle 105 via the network 135. As discussed in greater detail herein, the data compression selection module 205 selects a data compression process that can be used by the computer 110 to transmit vehicle data more efficiently based on hardware and/or software constraints of the vehicle 105.

The compression selection module 225 can receive metadata, e.g., vehicle metadata, and/or results initiates a process to select a best fit solution for compressing data. The metadata and/or results may be provided by the vehicle 105. In an example implementation, the metadata and/or results includes data transmission constraints corresponding to the vehicle 105. The compression selection module 225 can provide the constraints to the k-d tree search module 230 to cause the k-d tree search module 230 to select one or more data compression processes based on the data transmission constraints. Data transmission constraints can include, but are not limited to, central processing unit (CPU) usage, memory usage, latency, loss rate, input/output (I/O) cost, power consumption limit, and/or bandwidth limit. The results can comprise data representing vehicle execution results, i.e., data representing results from the vehicle implementing a particular data compression process, etc.

Data compression processes can include a lossy data compression process or a lossless data compression process. In an example implementation, based on the data type to compress, the data compression can comprise transform coding, adaptive sampling, quantization, differential coding, and/or arithmetic coding.

The k-d tree search module 230 can comprise a searchable data structure that stores possible solutions for data compression, such as compressing a portion of the vehicle data using a first data compression process, such as differential coding, and compressing the remaining portion of the vehicle data using a second data compression process, such as lossless, i.e., ZIP, etc.

The k-d tree search module 230 can select different data compression processes based on the vehicle data to be transmitted. In some instances, data having a first data type can be compressed using a first data compression process, and data having a second data type can be compressed using a second data compression process as discussed above. The k-d tree generated according to an adjusted metric space (discussed below) can account for parallel or sequential execution.

Figure 3:
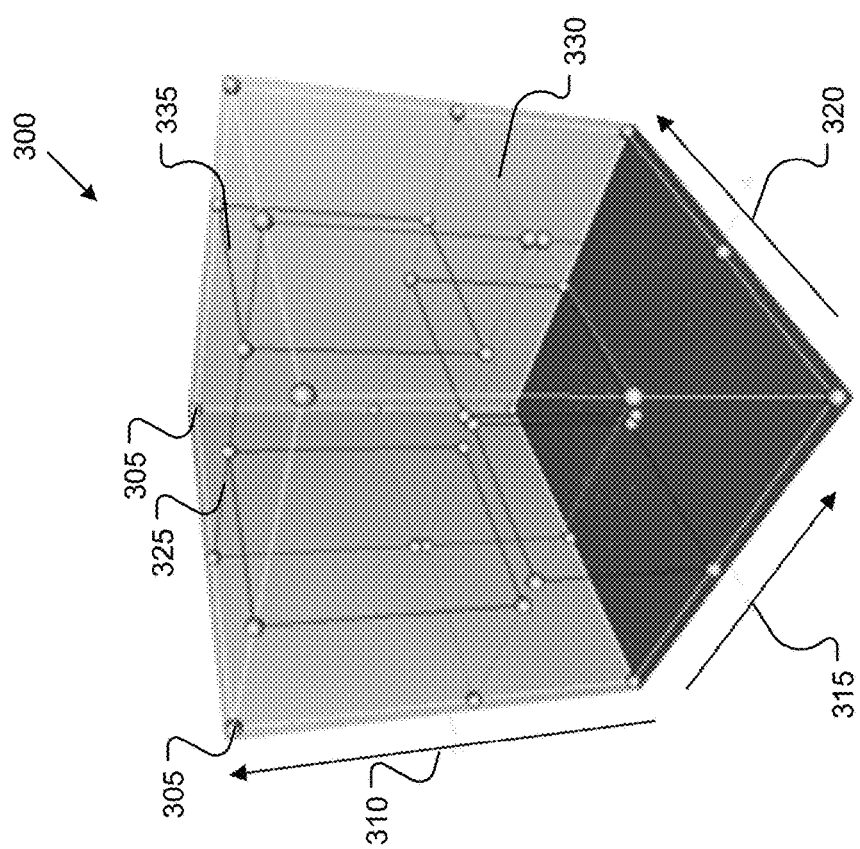
FIG. 3 is a diagrammatic illustration of an example k-d tree.

FIG. 3 illustrates an example k-d tree 300 generated by the k-d tree search module 230 that stores data compression processes. The k-d tree 300 includes multiple nodes 305, and each node 305 comprises a k-dimensional point representing possible data compression process solutions The parameter k can represent the number of dimensions of the k-d tree 300. In an example implementation, the k-d tree 300 can comprise three (3) dimensions that include central processing unit (CPU) usage 310 parameters, memory usage 315 parameters, and latency 320 parameters. However, it is understood that the k-d tree 300 can include additional or fewer dimensions. The k-d tree 300 can further be divided into multiple half-spaces 325, 330, 335 based on the non-leaf nodes.

Using techniques as discussed herein, the k-d tree search module 230 selects the data compression process to be used by the computer 110 based on the initial data transmission constraints and data received from the metrics space adjustment module 215. For example, the k-d tree search module 230 can initially generate the k-d tree 300 using the initial constraints corresponding to the vehicle data and/or an adjusted metric space received from the metrics space adjustment module 215.

During searching, the k-d tree search module 230 can begin at a root node 305 and traverse the nodes 305 to identify the nearest node 305 to a point represented by the initial constraints. For instance, given a candidate set of $x \in \{E_1, E_2, E_3, \ldots, E_n\}$, the k-d tree search module 230 identifies a data compression process having a minimum cost according to $$\min_{x \in \{E_1, E_2, E_3 \ldots E_n\}} f(\varphi_1, \varphi_2, \varphi_3, \varphi_4, \varphi_5, \varphi_6, \varphi_7),$$

where x is the set representing the data compression processes, min represents a function that identifies the selected data compression process having the highest compression ratio, $\varphi_1$ represents an upper threshold for memory usage, $\varphi_2$ represents an upper threshold for CPU usage, $\varphi_3$ represents an upper threshold for latency, $\varphi_4$ represents an upper threshold for loss rate, cps represents an upper threshold for I/O cost, $\varphi_6$ represents an upper threshold for power consumption, and $\varphi_7$ represents a upper threshold for bandwidth limit.

The k-d tree search module 230 can implement a gradient-based search when the k-d tree is expanded, i.e., additional nodes 305 are inserted. The gradient-based search can be terminated when a local minimum has been identified or a condition boundary has been reached.

The compression transmission module 235 receives the selected data compression process(es) from the k-d tree search module 230 and transmits the selected data compression process(es) to the computer 110 via the network 135. The computer 110 can implement the selected data compression process to compress vehicle data prior to transmission.

The statistical analysis module 210 can receive vehicle metadata corresponding to transmitted vehicle data and generates analysis data based on statistical analysis of the vehicle metadata. The vehicle metadata can include, but is not limited to, central processing unit (CPU) usage, memory usage, latency, loss rate, input/output (I/O) cost, power consumption limits, and/or bandwidth limits used, e.g., consumed, to compress the vehicle data prior to transmission. The statistical analysis module 210 can apply suitable statistical analysis processes to the received vehicle metadata. For example, the statistical analysis module 210 can compare the vehicle metadata with corresponding threshold data.

The threshold data can comprise expected values for central processing unit (CPU) usage, memory usage, latency, loss rate, input/output (I/O) cost, power consumption limits, and/or bandwidth limits based on vehicle 105 type. The statistical analysis module 210 can output the statistical analysis data to the metrics space adjustment module 210. In some instances, the threshold data can comprise vehicle performance metrics.

The metric space initialization module 220 generates an initial metric space based on the vehicle metadata received from the vehicle 105. The metric space comprises a non-empty set along with a metric parameter that defines a distance between at least two members of the set. With the context of the present disclosure, the metric space can comprise a Euclidean space that defines a distance between various nodes 305 of the k-d tree. The metric space initialization module 220 can generate the initial metric space using suitable emulation and data interpretation processes. For example, the metric space initialization module 220 can use hardware and/or software parameters corresponding to the vehicle 105 to emulate computing costs corresponding to the different methods and/or combinations of data compression processes.

The metrics space adjustment module 215 receives input from the statistical analysis module 210 and update the metric space based on the received statistical analysis data. For example, Euclidean distance between various nodes within the k-d tree can be updated based on the comparison of the metadata with corresponding threshold data. In some instances, the metrics space adjustment module 215 can expand the metric space of the k-d tree by inserting additional nodes 305 that represent an additional possible data compression solution.

Figure 4:
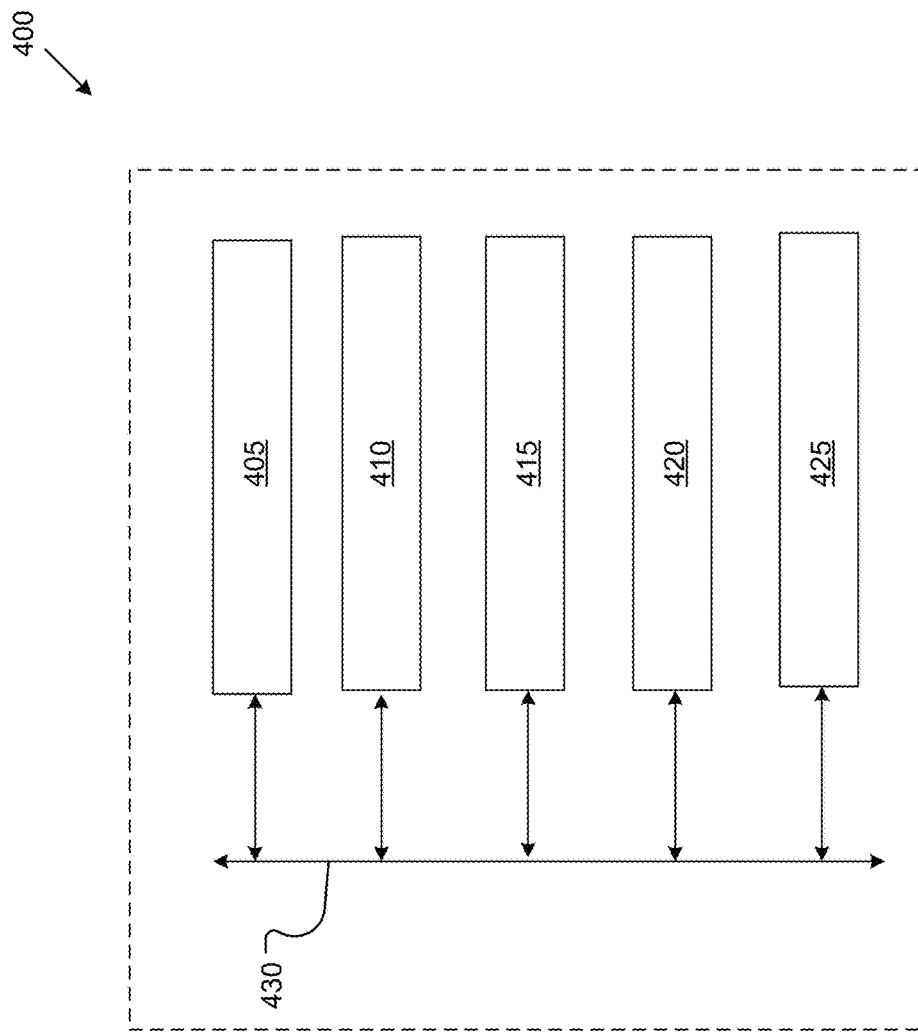
FIG. 4 is a block diagram of an example computing device.

FIG. 4 illustrates an example computing device 400 i.e., computer 110 and/or server(s) 145 that may be configured to perform one or more of the processes described herein. As shown, the computing device can comprise a processor 405, memory 410, a storage device 415, an I/O interface 420, and a communication interface 425. Furthermore, the computing device 300 can include an input device such as a touchscreen, mouse, keyboard, etc. In certain implementations, the computing device 400 can include fewer or more components than those shown in FIG. 4.

In particular implementations, processor(s) 405 includes hardware for executing instructions, such as those making up a computer program. As an example, and not by way of limitation, to execute instructions, processor(s) 405 may retrieve (or fetch) the instructions from an internal register, an internal cache, memory 410, or a storage device 415 and decode and execute them.

The computing device 400 includes memory 410, which is coupled to the processor(s) 405. The memory 410 may be used for storing data, metadata, and programs for execution by the processor(s). The memory 410 may include one or more of volatile and non-volatile memories, such as Random-Access Memory ("RAM"), Read Only Memory ("ROM"), a solid-state disk ("SSD"), Flash, Phase Change Memory ("PCM"), or other types of data storage. The memory 410 may be internal or distributed memory.

The computing device 400 includes a storage device 415 includes storage for storing data or instructions. As an example, and not by way of limitation, storage device 415 can comprise a non-transitory storage medium described above. The storage device 415 may include a hard disk drive (HDD), flash memory, a Universal Serial Bus (USB) drive or a combination of these or other storage devices.

The computing device 400 also includes one or more input or output ("I/O") devices/interfaces 420, which are provided to allow a user to provide input to (such as user strokes), receive output from, and otherwise transfer data to and from the computing device 400. These I/O devices/interfaces 420 may include a mouse, keypad or a keyboard, a touch screen, camera, optical scanner, network interface, modem, other known I/O devices or a combination of such I/O devices/interfaces 420. The touch screen may be activated with a writing device or a finger.

The I/O devices/interfaces 420 may include one or more devices for presenting output to a user, including, but not limited to, a graphics engine, a display (e.g., a display screen), one or more output drivers (e.g., display drivers), one or more audio speakers, and one or more audio drivers. In certain implementations, devices/interfaces 420 is configured to provide graphical data to a display for presentation to a user. The graphical data may be representative of one or more graphical user interfaces and/or any other graphical content as may serve a particular implementation.

The computing device 400 can further include a communication interface 425. The communication interface 425 can include hardware, software, or both. The communication interface 425 can provide one or more interfaces for communication (such as, for example, packet-based communication) between the computing device and one or more other computing devices 400 or one or more networks. As an example, and not by way of limitation, communication interface 425 may include a network interface controller (NIC) or network adapter for communicating with an Ethernet or other wire-based network or a wireless NIC (WNIC) or wireless adapter for communicating with a wireless network, such as a WI-FI. The computing device 400 can further include a bus 430. The bus 430 can comprise hardware, software, or both that couples components of computing device 400 to each other.

Figure 5:
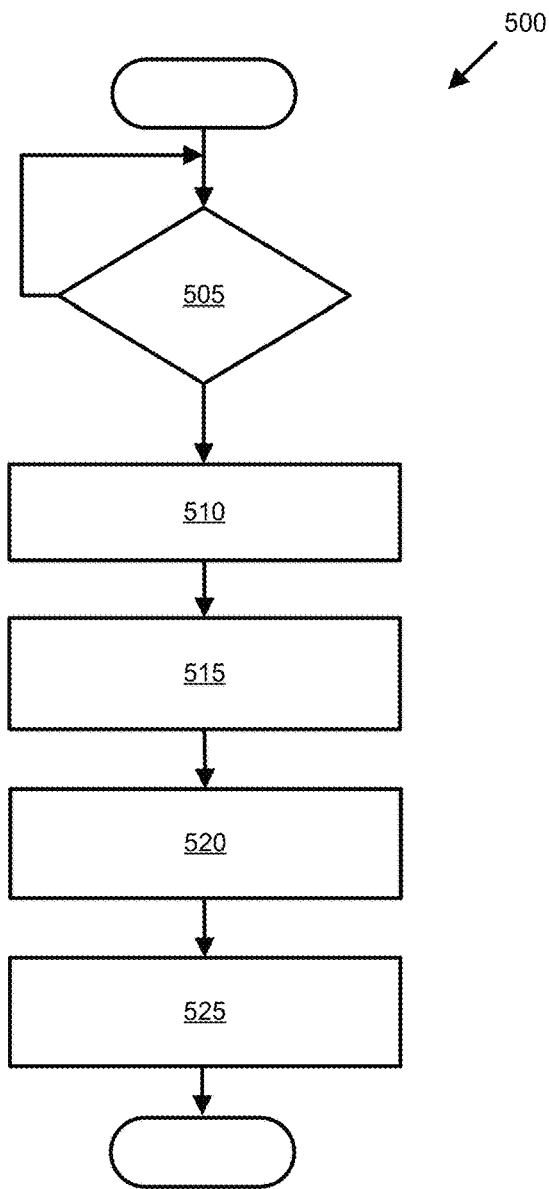
FIG. 5 is a flow diagram illustrating an example process for selecting a data compression process based on data transmission constraints.

FIG. 5 illustrates an example process 500 for selecting a data compression process based on data transmission constraints. Blocks of the process 500 can be executed by the server 145. At block 505, a determination is made whether metadata and/or results have been received. If no metadata and/or no results have been received, the process 500 returns to block 505. Otherwise, the compression selection module 225 provides the metadata and/or results to the k-d tree search module 230 at block 510.

At block 515, the k-d tree search module 230 selects at least one data compression process based on constraints within the metadata and/or results. In some implementations, the k-d tree search module 230 selects multiple data compression processes based on the data type, i.e., integer, character, image, audio, of the data to be transmitted.

The k-d tree search module 230 provides the selected data compression process(es) to the compression transmission module 235 at block 520. At block 525, the compression transmission module 235 transmits the data compression process(es) to the computer 110 via the network 135. The process 500 then ends.

The description of the present disclosure is merely exemplary in nature and variations that do not depart from the gist of the present disclosure are intended to be within the scope of the present disclosure. Such variations are not to be regarded as a departure from the spirit and scope of the present disclosure.

In general, the computing systems and/or devices described may employ any of a number of computer operating systems, including, but by no means limited to, versions and/or varieties of the Microsoft Automotive® operating system, the Microsoft Windows® operating system, the Unix operating system (e.g., the Solaris® operating system distributed by Oracle Corporation of Redwood Shores, California), the AIX UNIX operating system distributed by International Business Machines of Armonk, New York, the Linux operating system, the Mac OSX and iOS operating systems distributed by Apple Inc. of Cupertino, California, the BlackBerry OS distributed by Blackberry, Ltd. of Waterloo, Canada, and the Android operating system developed by Google, Inc. and the Open Handset Alliance, or the QNX® CAR Platform for Infotainment offered by QNX Software Systems. Examples of computing devices include, without limitation, an on-board vehicle computer, a computer workstation, a server, a desktop, notebook, laptop, or handheld computer, or some other computing system and/or device.

Computers and computing devices generally include computer executable instructions, where the instructions may be executable by one or more computing devices such as those listed above. Computer executable instructions may be compiled or interpreted from computer programs created using a variety of programming languages and/or technologies, including, without limitation, and either alone or in combination, Java™, C, C++, Matlab, Simulink, Stateflow, Visual Basic, Java Script, Perl, HTML, etc. Some of these applications may be compiled and executed on a virtual machine, such as the Java Virtual Machine, the Dalvik virtual machine, or the like. In general, a processor (e.g., a microprocessor) receives instructions, e.g., from a memory, a computer readable medium, etc., and executes these instructions, thereby performing one or more processes, including one or more of the processes described herein. Such instructions and other data may be stored and transmitted using a variety of computer readable media. A file in a computing device is generally a collection of data stored on a computer readable medium, such as a storage medium, a random-access memory, etc.

Memory may include a computer readable medium (also referred to as a processor readable medium) that includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random-access memory (DRAM), which typically constitutes a main memory. Such instructions may be transmitted by one or more transmission media, including coaxial cables, copper wire and fiber optics, including the wires that comprise a system bus coupled to a processor of an ECU. Common forms of computer readable media include, for example, a floppy disk, a flexible disk, hard disk, magnetic tape, any other magnetic medium, a CD ROM, DVD, any other optical medium, punch cards, paper tape, any other physical medium with patterns of holes, a RAM, a PROM, an EPROM, a FLASH EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

With regard to the media, processes, systems, methods, heuristics, etc. described herein, it should be understood that, although the steps of such processes, etc. have been described as occurring according to a certain ordered sequence, such processes may be practiced with the described steps performed in an order other than the order described herein. It further should be understood that certain steps may be performed simultaneously, that other steps may be added, or that certain steps described herein may be omitted. In other words, the descriptions of processes herein are provided for the purpose of illustrating certain implementations, and should in no way be construed so as to limit the claims.

Accordingly, it is to be understood that the above description is intended to be illustrative and not restrictive. Many implementations and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future implementations. In sum, it should be understood that the invention is capable of modification and variation and is limited only by the following claims.

All terms used in the claims are intended to be given their plain and ordinary meanings as understood by those skilled in the art unless an explicit indication to the contrary in made herein. In particular, use of the singular articles such as "a,"

"the," "said," etc. should be read to recite one or more of the indicated elements unless a claim recites an explicit limitation to the contrary.

What is claimed is:

1. A system comprising:
a vehicle;
a remote network;
a computer located within the remote network including a processor and a memory, the memory including instructions such that the processor is programmed to:
receive, from the vehicle, metadata and results corresponding to at least one data transmission constraint;
perform a search of a k-d tree based on the at least one data transmission constraint; and
select at least one data compression process from the k-d tree based on the search, wherein the k-d tree includes a plurality of nodes corresponding to data compression solutions; and
transmit the at least one data compression process to the vehicle; and
a second computer located in the vehicle including a second processor and a second memory, the second memory including instructions such that the second processor is programmed to:
compress vehicle data using the at least one data compression process; and
transmit the vehicle data compressed by the at least one data compression process.

2. The system of claim 1, wherein the metadata and the results are transmitted by the vehicle to the remote network.

3. The system of claim 1, wherein the processor is further programmed to perform a gradient-based search when at least one additional node has to be inserted into the k-d tree.

4. The system of claim 1, wherein the at least one data compression process comprises at least a lossy data compression process or a lossless data compression process.

5. The system of claim 1, wherein compressing data according to the selected data compression process comprises at least one of transform coding, adaptive sampling, quantization, differential coding, or arithmetic coding.

6. The system of claim 1, wherein the processor is further programmed to select a first data compression process for a first portion of vehicle data and select a second data compression process for a second portion of vehicle data, wherein the second data compression process is different from the first data compression process.

7. The system of claim 1, wherein the data compression constraint comprises at least one of central processing unit (CPU) usage, memory usage, latency, loss rate, input/output (I/O) cost, power consumption limit, or bandwidth limit.

8. The system of claim 1, wherein the processor is further programmed to generate a metric space based on emulating at least computing costs corresponding to a vehicle, wherein the metric space comprises a plurality of data compression process solutions for compressing vehicle data.

9. The system of claim 8, wherein the metric space comprises a Euclidean space defining a distance between at least a first node and a second node of the plurality of nodes.

10. A method comprising:
receiving, by a remote network, metadata and results corresponding to at least one data transmission constraint;
performing a search of a k-d tree based on the at least one data transmission constraint;
selecting at least one data compression process from the k-d tree based on the search, wherein the k-d tree includes a plurality of nodes corresponding to data compression solutions;
transmitting, by the remote network, the at least one data compression process to a vehicle;
implementing, by the vehicle, the at least one data compression process to compress vehicle data; and
transmitting, by the vehicle, the compressed vehicle data.

11. The method of claim 10, wherein the metadata and the results are transmitted by the vehicle to the remote network.

12. The method of claim 11, the method further comprising performing a gradient-based search when at least one additional node has to be inserted into the k-d tree.

13. The method of claim 10, wherein the at least one data compression process comprises at least one of a lossy data compression process or a lossless data compression process.

14. The method of claim 10, wherein compressing data according to the selected data compression process comprises at least one of transform coding, adaptive sampling, quantization, differential coding, or arithmetic coding.

15. The method of claim 10, the method further comprising selecting a first data compression process for a first portion of vehicle data and select a second data compression process for a second portion of vehicle data, wherein the second data compression process is different from the first data compression process.

16. The method of claim 10, wherein the data compression constraint comprises at least one of central processing unit (CPU) usage, memory usage, latency, loss rate, input/output (I/O) cost, power consumption limit, or bandwidth limit.

17. The method of claim 10, the method further comprising generating a metric space based on emulating at least computing costs corresponding to a vehicle, wherein the metric space comprises a plurality of data compression process solutions for compressing vehicle data.

18. The method of claim 17, wherein the metric space comprises a Euclidean space defining a distance between at least a first node and a second node of the plurality of nodes.

* * * * *